United States Patent
Yu et al.

(10) Patent No.: US 7,180,782 B2
(45) Date of Patent: Feb. 20, 2007

(54) READ SOURCE LINE COMPENSATION IN A NON-VOLATILE MEMORY

(75) Inventors: Chuan-Ying Yu, Taichung (TW); Nai-Ping Kuo, Hsinchu (TW); Ken-Hui Chen, Dali (TW); Han-Sung Chen, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/151,168

(22) Filed: Jun. 10, 2005

(65) Prior Publication Data

US 2006/0279996 A1    Dec. 14, 2006

(51) Int. Cl.
    *G11C 16/28*    (2006.01)
(52) U.S. Cl. .................. 365/185.21; 365/63; 365/185.2
(58) Field of Classification Search ........... 365/185.21, 365/185.2
    See application file for complete search history.

(56) References Cited

U.S. PATENT DOCUMENTS

| | | | |
|---|---|---|---|
| 4,094,008 A * | 6/1978 | Lockwood et al. ......... 365/149 |
| 5,335,198 A * | 8/1994 | Van Buskirk et al. ... 365/185.3 |
| 6,751,131 B2 * | 6/2004 | Yamano ................ 365/189.07 |
| 6,754,106 B1 | 6/2004 | Wu et al. |
| 6,847,561 B2 * | 1/2005 | Hashimoto et al. ..... 365/189.07 |

* cited by examiner

*Primary Examiner*—Tan T. Nguyen
(74) *Attorney, Agent, or Firm*—Jonlin Su; Haynes Beffel & Wolfeld LLP

(57) ABSTRACT

Non-volatile memory circuits according to the present invention provide a reference memory having multiple reference cells that are shared among a group of sense amplifiers through an interconnect conductor line. The higher number of reference cells for each reference memory generates a greater amount of electrical current for charging multiple source lines. The multiple source lines are coupled to the interconnect conductor bar for capacitance matching with a source line coupled to a memory cell in a main memory array. After a silicon wafer out, measurements to the capacitance produced by the source line in the main memory array and the capacitance produced by the source line in the reference array are taken for an optional trimming. A further calibration in capacitance matching is achieved by trimming one of the source lines that is coupled to the interconnect conductor bar and the reference memory, either by cutting a portion of the source line or adding a portion to the source line.

12 Claims, 11 Drawing Sheets

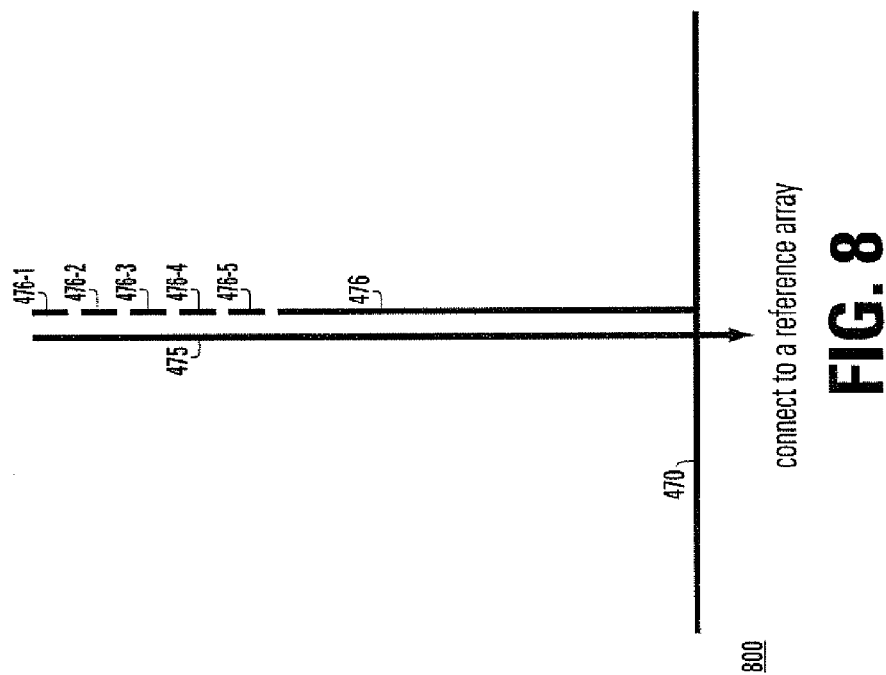

READ SOURCE LINE COMPENSATION IN A NON-VOLATILE MEMORY

BACKGROUND OF THE INVENTION

1. Field of the Invention

The present invention relates generally to integrated-circuit memory arrays, and in particular, to adjusting read source line coupled to a reference array for capacitance matching with a memory array.

2. Description of Related Art

Electrically programmable and erasable non-volatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a non-volatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names NROM, SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

NROM devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of an NROM flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious as the technology keeps scaling down.

A typical flash memory cell structure positions a tunnel oxide layer between a conducting polysilicon tunnel oxide layer and a crystalline silicon semiconductor substrate. The term "substrate" refers to a source region and a drain region separated by an underlying channel region. A flash memory read can be executed by a drain sensing or a source sensing. For source side sensing, one or more source lines are coupled to source regions of memory cells for reading current from a particular memory cell in a memory array.

FIG. 1 is a block diagram illustrating a conventional source sensing memory circuit 100 with a main memory array 120 coupled to multiple reference mini-arrays 140, 141, 142, 143, 144 and 146 through a Y-pass gate 130 in a non-volatile memory with 1C:1C source side sensing scheme. The 1C:1C ratio denotes a single memory cell in the main memory array 120 as opposed to a single reference cell in a specific reference array. Sixty-four sense amplifiers SA0 110, SA1 111, . . . SA31 112, SA32 113, . . . SA62 114 and SA63 115 are typically required to perform a read operation. Each sense amplifier in the memory circuit 100 is associated with a reference cell in a particular reference mini-array and a source line. The specific connections are described as follows. The sense amplifier 110 receives a first input from a source line 160 connected to a memory cell 121 and a second input from a source line 170 connected to a reference cell 150. The sense amplifier 111 receives a first input from a source line 161 connected to a memory cell 122 and a second input from a source line 171 connected to a reference cell 151. The sense amplifier 112 receives a first input from a source line 162 connected to a memory cell 123 and a second input from a source line 172 connected to a reference cell 152. The sense amplifier 113 receives a first input from a source line 163 connected to a memory cell 124 and a second input from a source line 173 connected to a reference cell 153. The sense amplifier 114 receives a first input from a source line 164 connected to a memory cell 125 and a second input from a source line 174 connected to a reference cell 154. The sense amplifier 115 receives a first input from a source line 165 connected to a memory cell 126 and a second input from a source line 175 connected to a reference cell 155. A shortcoming of the memory circuit 100 is that the layout area will be large because each sense amplifier is associated with a particular reference mini-array and a particular source line coupled to the reference mini-array.

FIG. 2 is a block diagram illustrating another conventional source sensing memory circuit 200 with the main memory array 120 coupled to shared reference mini-arrays 210 and 220 in the non-volatile memory with a 1C:1C source side sensing scheme. Each reference mini-array is shared among thirty-two sense amplifiers by an interconnect conductor bar. The reference mini-array 210 includes a reference cell 211 connected to a reference metal bit line 212, which in turn is connected to an interconnect conductor bar 230, which is in turn connected to a source line 250 and the first thirty-two sense amplifiers, SA0 110, SA1 111, . . . SA31 112. The reference mini-array 220 includes a reference cell 221 connected to a reference metal bit line 222, which is in turn connected to an interconnect bar 240, which in turn is connected to a source line 260 and the next thirty-two sense amplifiers, SA32 113, SA62 114, . . . SA63 115. The interconnect conductor bars 230 and 240 tend to be lengthy, typically longer than 1000 μm. Although the interconnect bars 230 and 240 provide the backbone for sharing a reference mini-array between thirty-two sense amplifiers, the addition of an interconnect bar and one additional metal line for connecting between each sense amplifier and the interconnect conductor bar contribute to an increase in capacitance to a source line coupled to a reference mini-array, producing undesirable capacitance mismatching between source lines in a main memory array cell and a mini-array reference cell, as well as inducing margin loss with a read high Vt or a read low Vt.

Therefore, there is a need for a non-volatile memory that provides source side sensing in which the dimension of the layout area is reduced while compensating for capacitance mismatching arising between source lines of a memory cell in the main memory array and reference cells in a reference mini-array.

SUMMARY OF THE INVENTION

Non-volatile memory circuits according to the present invention provide a reference memory having multiple reference cells that are shared among a group of sense amplifiers through an interconnect conductor line. The higher number of reference cells for each reference memory generates a greater amount of electrical current for charging multiple source lines. The multiple source lines are coupled to the interconnect conductor bar for capacitance matching with a source line coupled to a memory cell in a main memory array. After a silicon wafer out, measurements of the capacitance produced by the source line in the main memory array, and the capacitance produced by the source line in the reference array, are taken for an optional trimming. A further calibration in capacitance matching is achieved by trimming one of the source lines that is coupled to the interconnect conductor bar and the reference memory, either by cutting a portion of the source line or adding a portion to the source line.

Broadly stated, a non-volatile memory structure, comprises an interconnect conductor bar; a main memory having a first memory cell; a first reference array having two or more reference memory cells, the two or more reference memory cells connected to a reference conductor line; a first sense amplifier having a first input coupled to a first conductor bit line connected to the first memory cell in the main memory, and a second input coupled to the interconnect conductor bar and the reference conductor line in the two or more reference memory cells; and at least two source lines coupled to the interconnect conductor bar, the combination of the at least two source lines, the interconnect conductor bar, and the reference conductor line providing capacitance substantially matching to the first conductor bit line from the first memory cell in the main memory array.

In a first embodiment, a memory circuit with a 1C:2C source sensing scheme employs two reference arrays where each reference array includes two reference cells and two source lines. Having two reference cells in each reference array doubles the amount of cell current charged to the two source lines. The addition of the second source line coupled to a reference array keeps the ratio of metal bit line to source line coupled to a main memory array, matched well. Each reference array is shared among thirty-two sense amplifiers through an interconnect conductor bar. A pair of source lines are coupled to the interconnect conductor bar and a reference array to provide capacitance matching to a source line connected to a memory cell.

In a second embodiment, a trimming option is available after silicon wafer out for adjustment of a source line coupled to a reference array in the memory circuit with a 1C:2C source sensing scheme. After silicon wafer out, memory circuits are placed in test mode to measure the real source line differential between the source line from a main memory cells and the source line from reference memory cells. One of the source lines coupled to the reference array has several segments in the top portion of the source lines that can be cut by using a focused ion beam for reducing capacitance. If more capacitance is required on the reference array side, additional metal segments can be added to the one of the source lines coupled to the reference array.

In a third embodiment, a memory circuit with a 1C:3C source sensing scheme employs two reference arrays where each reference array includes three reference cells and three source lines. Three reference cells in each reference array triple the amount of cell current charged to the three source lines. The addition of the second and third source lines coupled to a reference array are to keep the ratio of metal bit line matched well with a source line coupled to a main memory array. Each reference array is shared among thirty-two sense amplifiers through the interconnect conductor bar. In this embodiment, one of the source lines coupled to the reference memory is also adjustable after the silicon wafer out, to reduce or increase the amount of capacitance on one of the source lines coupled to a reference array.

Advantageously, the present invention reduces the physical footprint in a layout area on an integrated circuit memory chip by sharing reference memories between sense amplifiers. The present invention further advantageously provides a flexible technique to match capacitance coupling to a sense amplifier with the option to trim, either by cutting or adding one or more segments in a source line among several source lines coupled to a reference memory.

The structures and methods of the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

BRIEF DESCRIPTION OF THE DRAWINGS

FIG. 8 is a block diagram illustrating the source side trimming in a non-volatile memory for capacitance matching with a 1C:2C source sensing scheme in accordance with the present invention.

DETAILED DESCRIPTION OF EMBODIMENTS OF THE INVENTION

Figure 1:
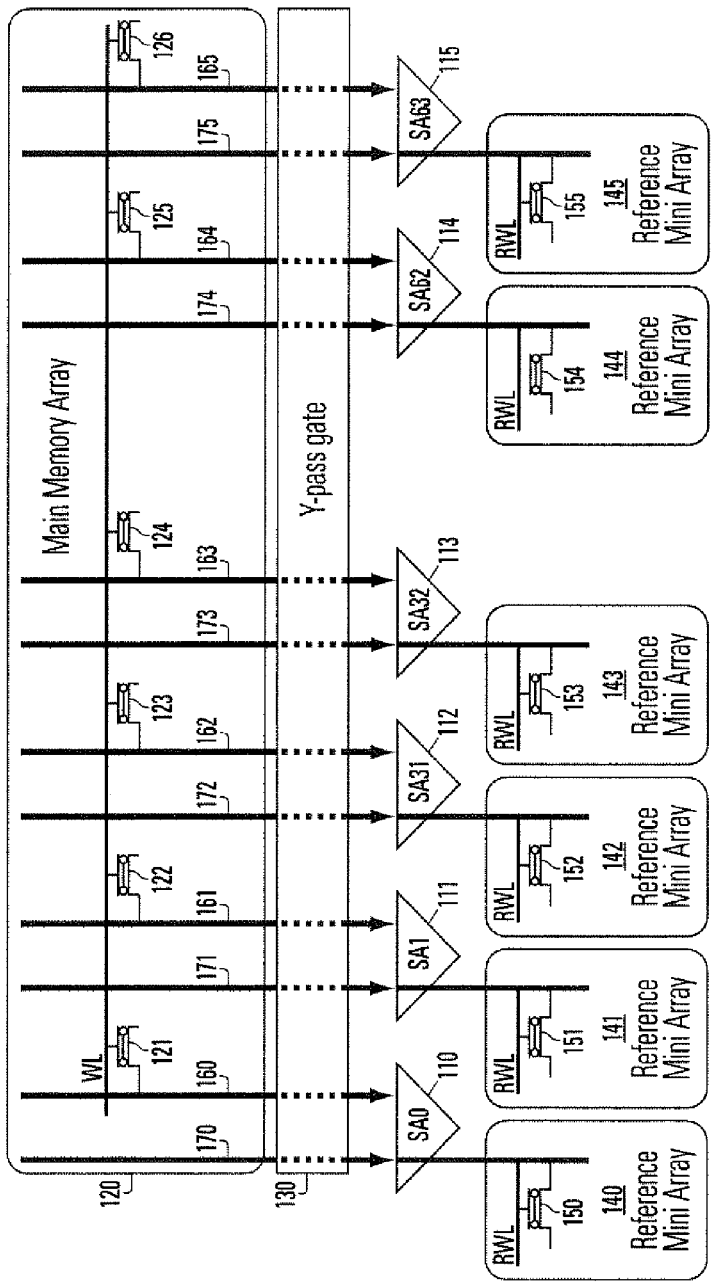
FIG. 1 is a prior art block diagram illustrating a source sensing memory circuit with a main memory array coupled to multiple reference mini-arrays in a non-volatile memory with 1C:1C source sensing scheme.
Figure 2:
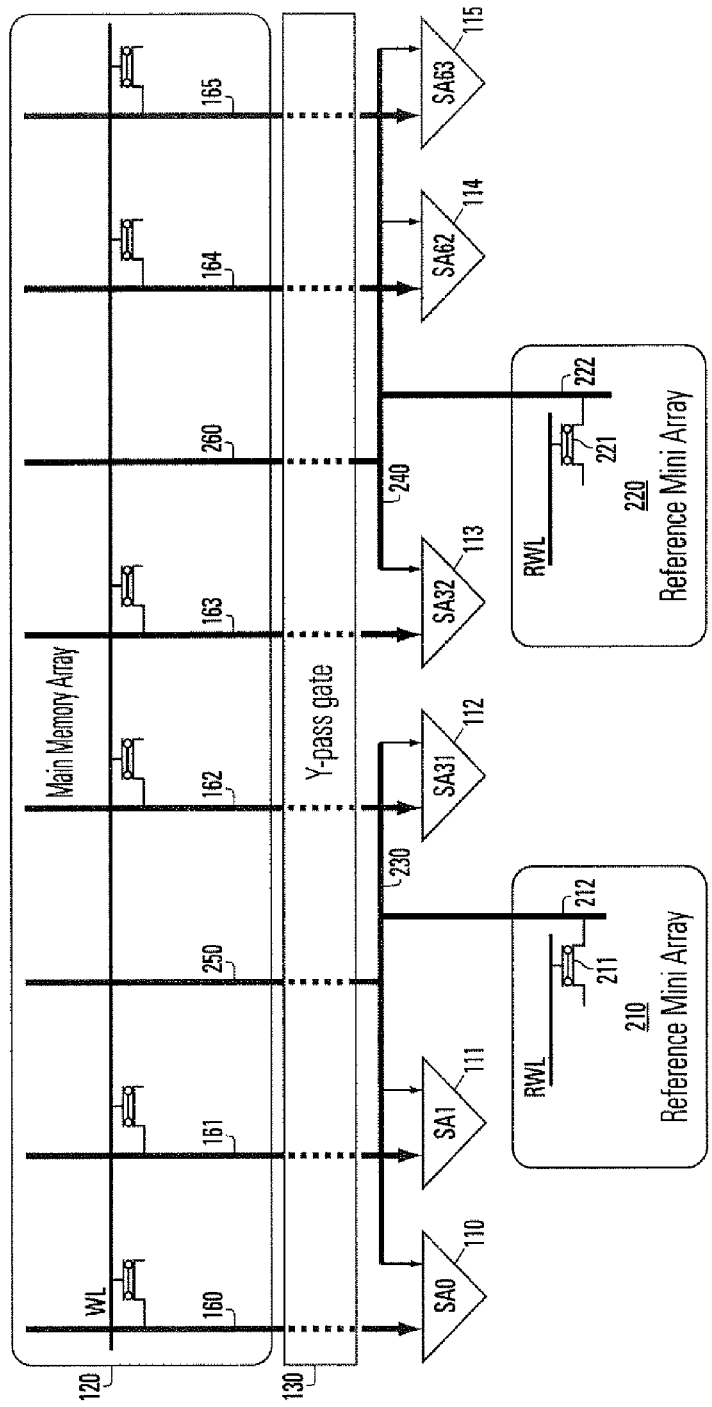
FIG. 2 is a prior art block diagram illustrating another source sensing memory circuit with a main memory array coupled to shared reference mini-arrays in a non-volatile memory with 1C:1C source sensing scheme.
Figure 3:
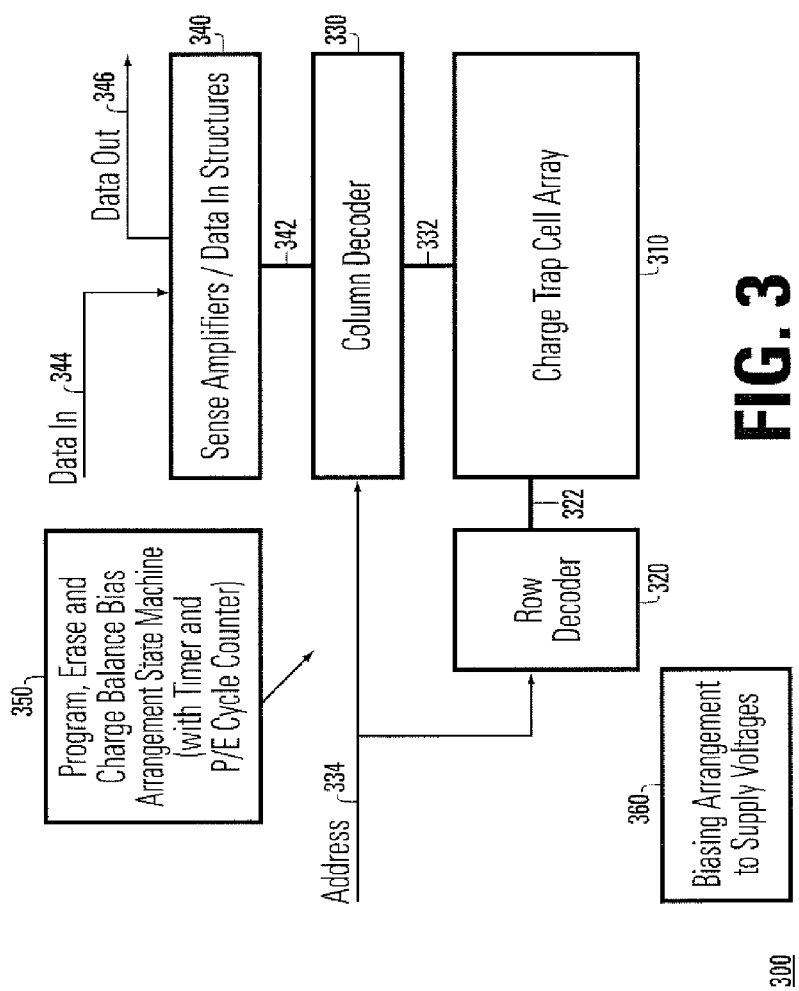
FIG. 3 is a simplified architectural diagram illustrating a non-volatile memory integrated circuit according to an embodiment of the present invention.

Referring now to FIG. 3, there is shown a simplified architectural diagram illustrating a non-volatile memory integrated circuit according to an embodiment of the present invention. The non-volatile memory integrated circuit 300 includes a memory array 310 implemented using localized charge trapping memory cells, on a semiconductor substrate. A row decoder 320 is coupled to a plurality of wordlines 322 arranged along rows in the memory array 310. A column decoder 330 is coupled to a plurality of bitlines 332 arranged along columns in the memory array 310. Addresses are supplied on bus 334 to column decoder 330 and row decoder 320. Sense amplifiers and data-in structures in block 340 are coupled to the column decoder 330 via data bus 342. Data is supplied via the data-in line 344 from input/output ports on the integrated circuit 300, or from other data sources internal or external to the integrated circuit 300, to the data-in structures in block 340. Data is supplied via the data-out line 346 from the sense amplifiers in block 340 to input/output ports on the integrated circuit 300, or to other data destinations internal or external to the integrated circuit 300. A bias arrangement state machine 350 controls the application of bias arrangement supply voltages 360, such as for the erase verify and program verify voltages, the first and second bias arrangements for programming and lowering the threshold voltage of the memory cells, and the third bias arrangement to change a distribution of charge in the charge trapping structure of a memory cell.

Figure 4:
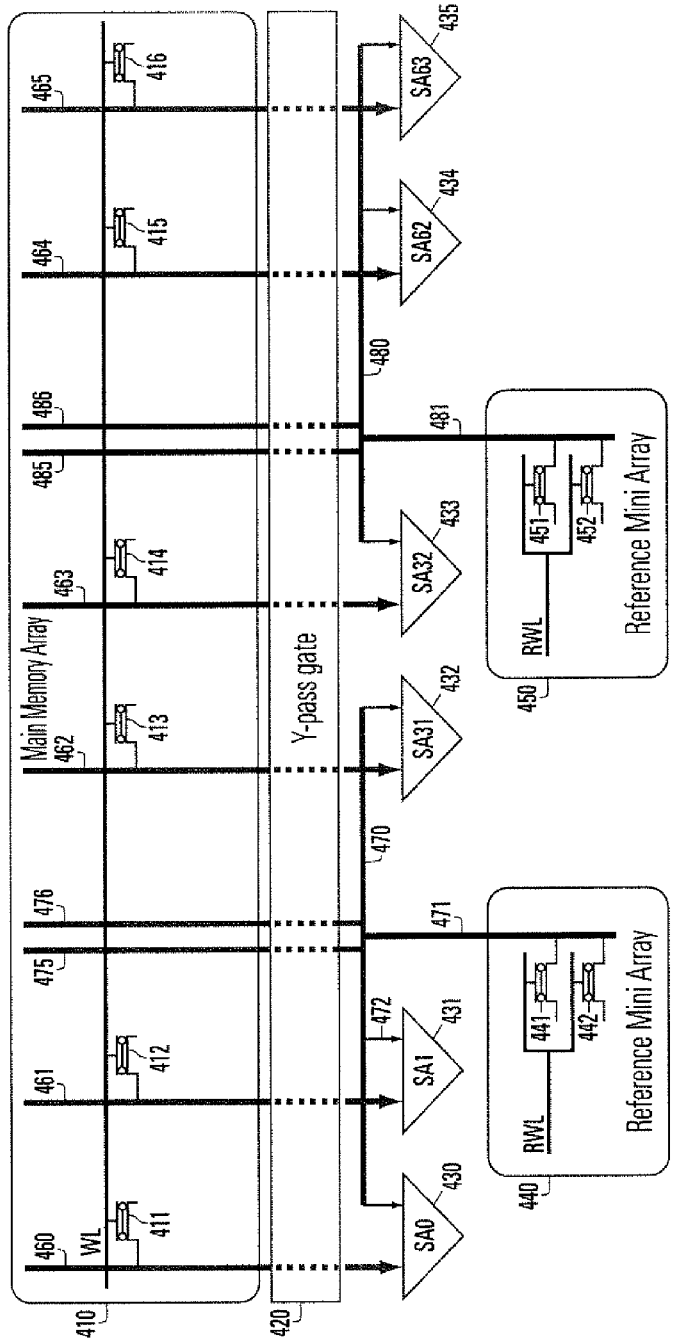
FIG. 4 is a simplified circuit diagram illustrating a first embodiment of a source sensing memory circuit in a non-volatile memory with a 1C:2C source sensing scheme in accordance with the present invention.

In FIG. 4, there is shown a simplified circuit diagram illustrating a first embodiment of a source sensing memory circuit 400 in a non-volatile memory with a 1C:2C source sensing scheme. In the 1C:2C source sensing scheme configuration, the ratio employs two reference memory cells in a reference array to one memory cell in a main memory array 410. The reference mini-array 440 includes two reference cells 441 and 442 relative to a memory cell 411, a memory cell 412, or a memory cell 413 in the main memory array 410. The reference mini-array 450 includes two reference cells 451 and 452 relative to a memory cell 414, a memory cell 415, or a memory cell 416 in the main memory array 410.

There are a total of sixty-four sense amplifiers in the memory circuit 100. The first thirty-two sense amplifiers, SA0 430, SA1 431 . . . SA31 432, share a first reference array 440 by coupling to a first interconnect conductor bar 470, which in turn couples to source lines 475 and 476. The next thirty-two sense amplifiers, SA32 433, SA62 434 . . . SA63 435, share a second reference array 450 by coupling through a second interconnect conductor bar 480, which in turn couples to source lines 485 and 486. The sense amplifiers SA0 430, SA1 431 . . . SA63 435 may be implemented using a wide variety of differential sense amplifiers known to a person of skill in the art. The first interconnect conductor bar 470 provides a connection means to the first thirty-two sense amplifiers, but simultaneously contributes additional capacitance. To compensate for the increase in capacitance induced by the first interconnect conductor bar 470, two sources lines 475 and 476 are connected to the first interconnect conductor bar 470. The source lines 485 and 486 compensate for capacitance mismatching with the addition of the second interconnect conductor bar 480.

The first sense amplifier SA0 430 has a first input coupled to a source line 460 connected to the memory cell 411 through a Y-pass gate 420 and a second input coupled to the first interconnect conductor bar 470, which is coupled to reference cells 441, 442 and source lines 475, 476. The source lines 475 and 476 couple to the interconnect conductor bar 470 through the Y-pass gate 420. The second sense amplifier Sa1 431 has a first input coupled to a source line 461 connected to the memory cell 412 and a second input coupled to the first interconnect conductor bar 470, which couples to reference cells 441, 442 and source lines 475, 476. The thirty-first sense amplifier SA31 432 has a first input coupled to a source line 462 connected to the memory cell 413 and a second input coupled to the first interconnect conductor bar 470, which couples to reference cells 441, 442 and source lines 475, 476. The thirty-second sense amplifier SA32 433 has a first input coupled to a source line 463 connected to the memory cell 414 and a second input coupled to the first interconnect conductor bar 470, which couples to reference cells 441, 442 and source lines 475, 476. The sixty-third sense amplifier SA62 434 has a first input coupled to a source line 464 connected to the memory cell 415 and a second input coupled to the first interconnect conductor bar 470, which couples to reference cells 441, 442 and source lines 475, 476. The sixty-fourth sense amplifier SA63 435 has a first input coupled to a source line 465 connected to the memory cell 416 and a second input coupled to the first interconnect conductor bar 470, which couples to reference cells 441, 442 and source lines 475, 476.

One of the sense amplifiers compares two voltages to determine capacitance matching. For example, the sense amplifier SA 1 431 compares a first voltage from a source side metal bit line 461 in a main memory array to source lines 475, 476 from a reference array. The variables that affect source side sensing can be represented by the following the mathematical equation: $Q=CV=IT$, where the symbol Q denotes charge in capacitance, the symbol C denotes a bit line capacitance, the symbol V denotes the voltage change, the symbol I denotes the cell current, and the symbol T denotes the charging time. The first voltage from the source side metal bit line 461 and the second voltage from the source side metal bit line 475, 476 are stored within Tsensing. If variables C and T are fixed, then the variable V will be proportional to the variable I. Consequently, the voltage difference between the source side metal bit line 461 and the source side metal bit lines 475, 476 indicates the difference in the main memory cell current and the reference memory cell current. By controlling the reference memory cell current, it will determine the value of the voltage threshold, Vt, to be high/low or logic 1/logic 0.

When the process variation is significant, the ratio of the capacitance component will change, resulting in a capacitance mismatching between the source side metal bit line 461 in the main memory and the source side metal bit lines 475, 476 in the reference memory. This is turn creates a difference in the build voltage between the source side metal bit line 461 in the main memory array and the source side metal bit lines 475, 476 from a reference array. The read operation will fail if the voltage differential between the source side metal bit line 461 and the source side metal bit lines 475, 476 is smaller than the design specification. Therefore, it is significant to produce capacitance matching in compensating for the process variation.

Figure 5:
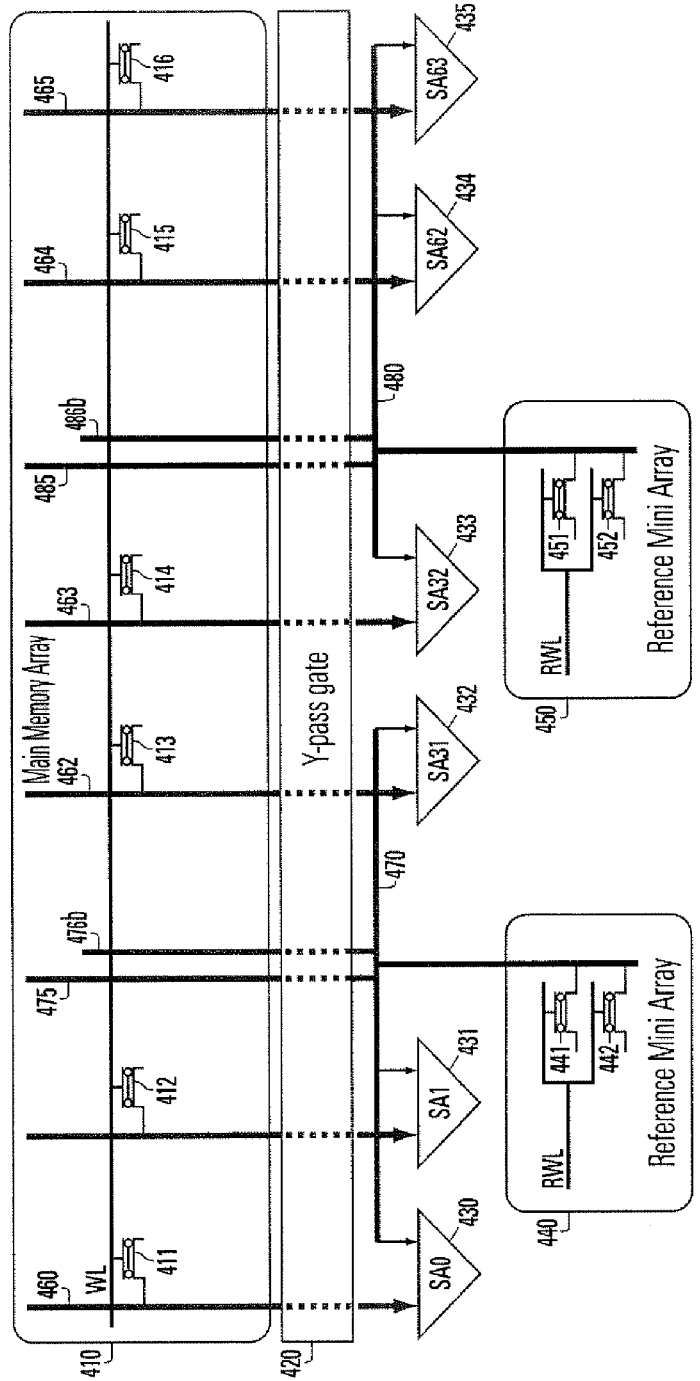
FIG. 5 is a simplified circuit diagram illustrating a second embodiment of a source sensing memory circuit in a non-volatile memory with a 1C:2C source sensing scheme in which one of the source lines can be trimmed in accordance with the present invention.

FIG. 5 is a simplified circuit diagram illustrating a second embodiment of a source sensing memory circuit 500 in a non-volatile memory with a 1C:2C source side sensing scheme where one of the source lines can be trimmed. The source sensing circuit 500 is manufactured as part of a memory chip on a dice of a wafer. Each die can be put in a test mode to measure the real source line tracking performance. If result of the measurement produces capacitance mismatching which requires adjustment, a source line 476b in the pair of sources lines 475 and 476b is trimmed to a desirable length by using focused ion beam (FIB) trimming, thereby reducing the length of the source line 476b.

Figure 6:
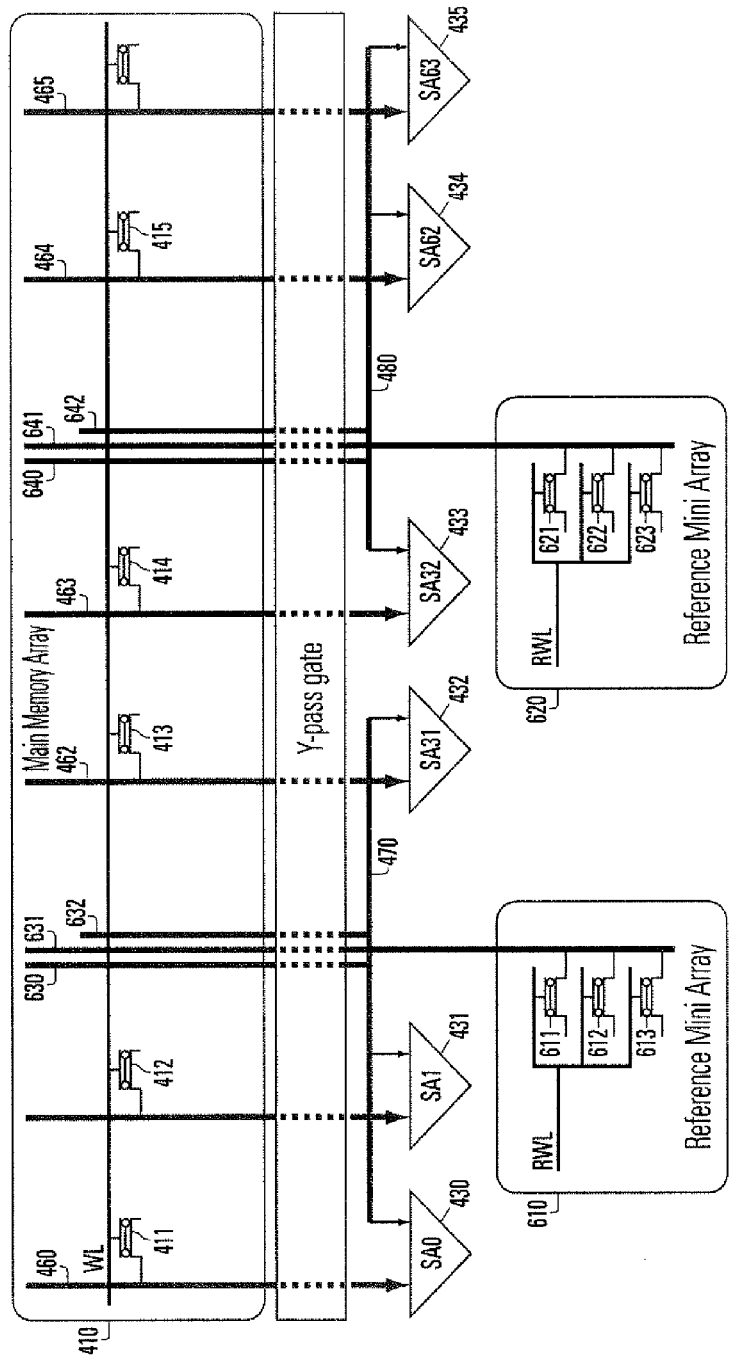
FIG. 6 is a simplified circuit diagram illustrating a third embodiment of a source sensing memory circuit in a non-volatile memory with a 1C:3C source side sensing scheme in which one of the source lines can be trimmed in accordance with the present invention.

FIG. 6, is a simplified circuit diagram illustrating a third embodiment of a source sensing memory circuit 600 in a non-volatile memory with a 1C:3C source side sensing scheme where one of the source lines can be trimmed. In the embodiment, the capacitance ratio of a metal bit line from the memory connected to a first input of a sense amplifier indicates that three source lines are required for suitable capacitance matching. A first reference array 610 has three reference memory cells 611, 612, and 613 that correspond to one memory cell, e.g. the memory cell 412, in the main memory array 410. The reference array 610 couples to the interconnect conductor bar 470 and three source lines 630, 631 and 632. A second reference array 620 includes three reference memory cells 621, 622 and 623 that correspond to a memory cell, e.g. the memory cell 414, in the main memory array 410. The reference array 620 couples to the interconnect conductor bar 480 and three source lines 640, 641 and 642. In this embodiment, the source line 632 is trimmed after measurement has been taken for capacitance mismatching after a silicon wafer out. The source line 642 is also trimmed after measurement has been taken for capacitance mismatching after the silicon wafer out.

Figure 7:
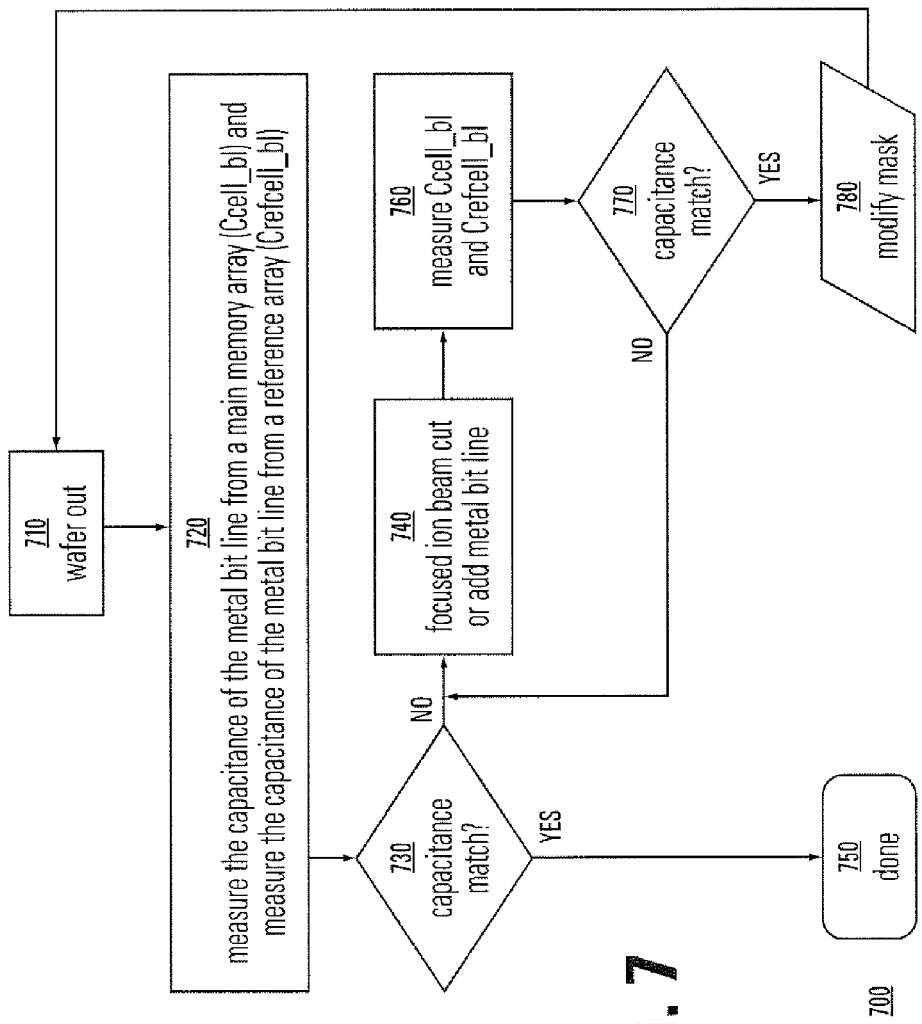
FIG. 7 is a flow chart illustrating the process for adjusting a source line in a plurality of source lines coupled to a reference array in a non-volatile memory to achieve capacitance matching between source lines from the main memory array and the reference array in accordance with the present invention.

Turning now to FIG. 7, there is shown a flow chart illustrating the process 700 for adjusting a source line in a plurality of source lines coupled to a reference array in a non-volatile to attain capacitance matching between metal bit lines from the main memory array and the reference array. At step 710, non-volatile memory circuits on dice of a silicon wafer have been manufactured. After putting the integrated circuit chips in test mode, at step 720, one measurement is taken of the capacitance of the metal bit line from a main memory array (Ccell bl) and another measurement is taken on the capacitance of the metal bit line from a reference array (Crefcell bl). At step 730, the measurement value of the metal bit line capacitance from a main memory array is compared to the measurement value of the metal bit line capacitance from a reference array to determine if there is matching capacitance. If the metal bit line capacitance from the main memory array does not match the metal bit line capacitance from the reference array, at step 740, the focused ion beam technique is used to adjust a source line in a plurality of source lines coupled to a reference mini-array by either cutting one or more segments from the source line, or adding one or more segments to the source line. If the result produces a capacitance mismatching because the metal bit line capacitance from the reference array is greater than the metal bit line capacitance from the main memory array, the process 700 cuts one or more segments in the top portion of a source line in the multiple source lines coupled to the reference array by using a focused ion beam. However, if the result produces a capacitance mismatching because the metal bit line capacitance from the reference array is less than the metal bit line capacitance from the main memory array, the process 700 adds one or more segments to the top portion of a source line in the multiple source lines coupled to the reference array by using a focused ion beam. If the process 700 determines at step 730 that there is capacitance matching between the metal bit line from the main memory array and the metal bit line from the reference array, the process 700 is completed at step 750.

At step 760, the measurement value of the metal bit line capacitance from the main memory array is once again compared to the measurement value of the metal bit line capacitance from the reference array. The measurement value of the metal bit line capacitance from a main memory array is compared at step 770 to the measurement value of the metal bit line capacitance from a reference array to determine whether there is a matching capacitance. If the metal bit line capacitance from the main memory array does not match the metal bit line capacitance from the reference array, the process 700 routes to step 740. If the metal bit line capacitance from the main memory array matches the metal bit line capacitance from the reference array, the mask is modified before returning to the initial step 710.

FIG. 8 is a block diagram illustrating the source side trimming 800 in a non-volatile memory for capacitance matching in a 1C:2C source side sensing scheme. The total amount of capacitance in the source line trimming 800 includes the first source line 475, the second source line 476, the interconnect conductor bar 470 and other parasitic capacitance such as junction capacitance and gate capacitance. The top portion of the second source line 476 is cut into five segments 476-1, 476-2, 476-3, 476-4 and 476-5. The total capacitance on the source side can be reduced by trimming one or more of the five segments 476-1, 476-2, 476-3, 476-4 and 476-, but can also be increased by connecting additional metal to the second source line 476.

Figure 9A:
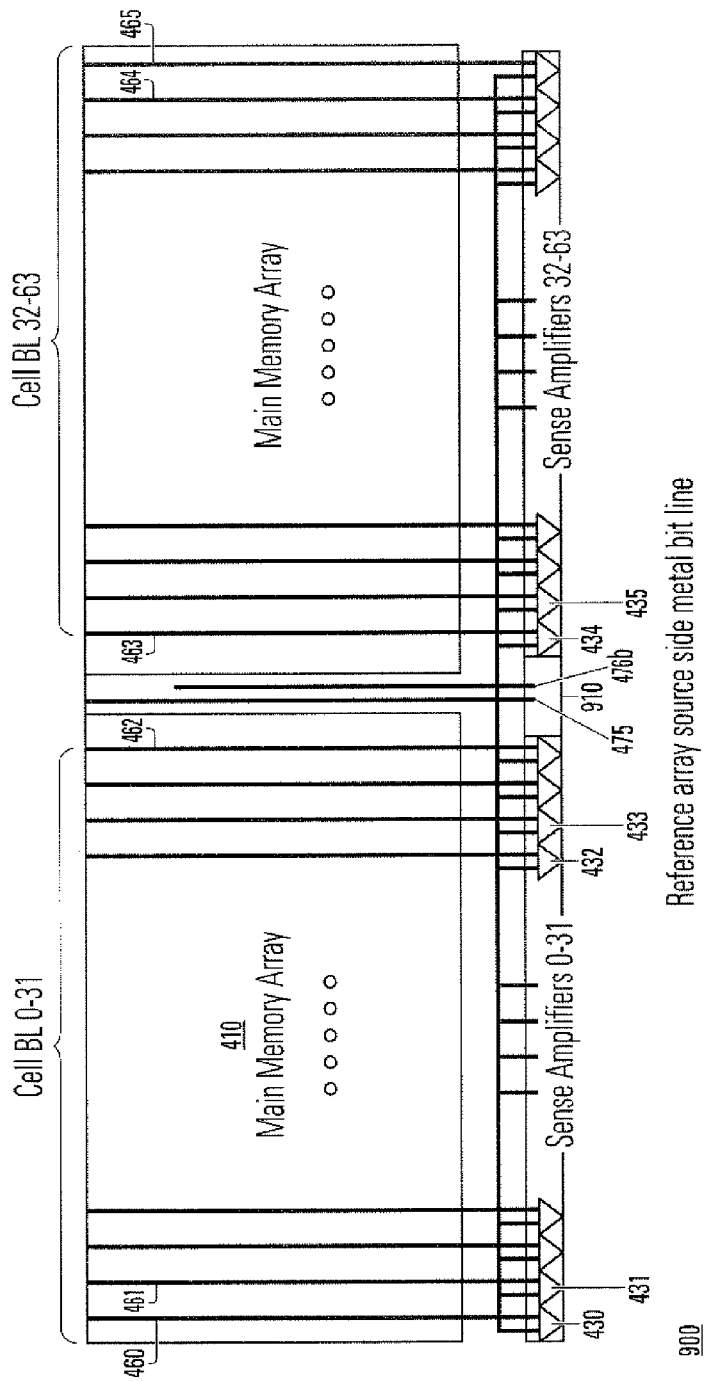
FIG. 9A is a more detailed block diagram illustrating a source sensing circuit in accordance with the present invention.
Figure 9B:
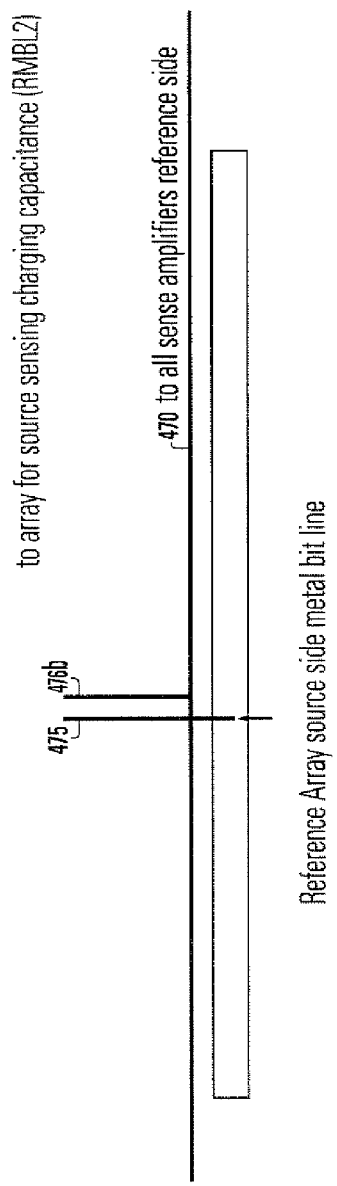
FIG. 9B is a simplified block diagram of the source lines coupling to an interconnect conductor bar and the reference array in accordance with the present invention.

FIG. 9A is a more detailed block diagram illustrating a source sensing memory circuit 900 that corresponds to the second embodiment of the present invention as shown in FIG. 5. The interconnect conductor bar 470 and source lines 475, 476b on the metal bit line on the reference array source side 910 are further depicted in FIG. 9B. The interconnect conductor bar 470 is connected to all sense amplifiers on the reference memory. The source lines 475 and 476b are connected to an array for source sensing charging capacitance, as shown by the symbol RMBL2 in FIG. 10.

Figure 10:
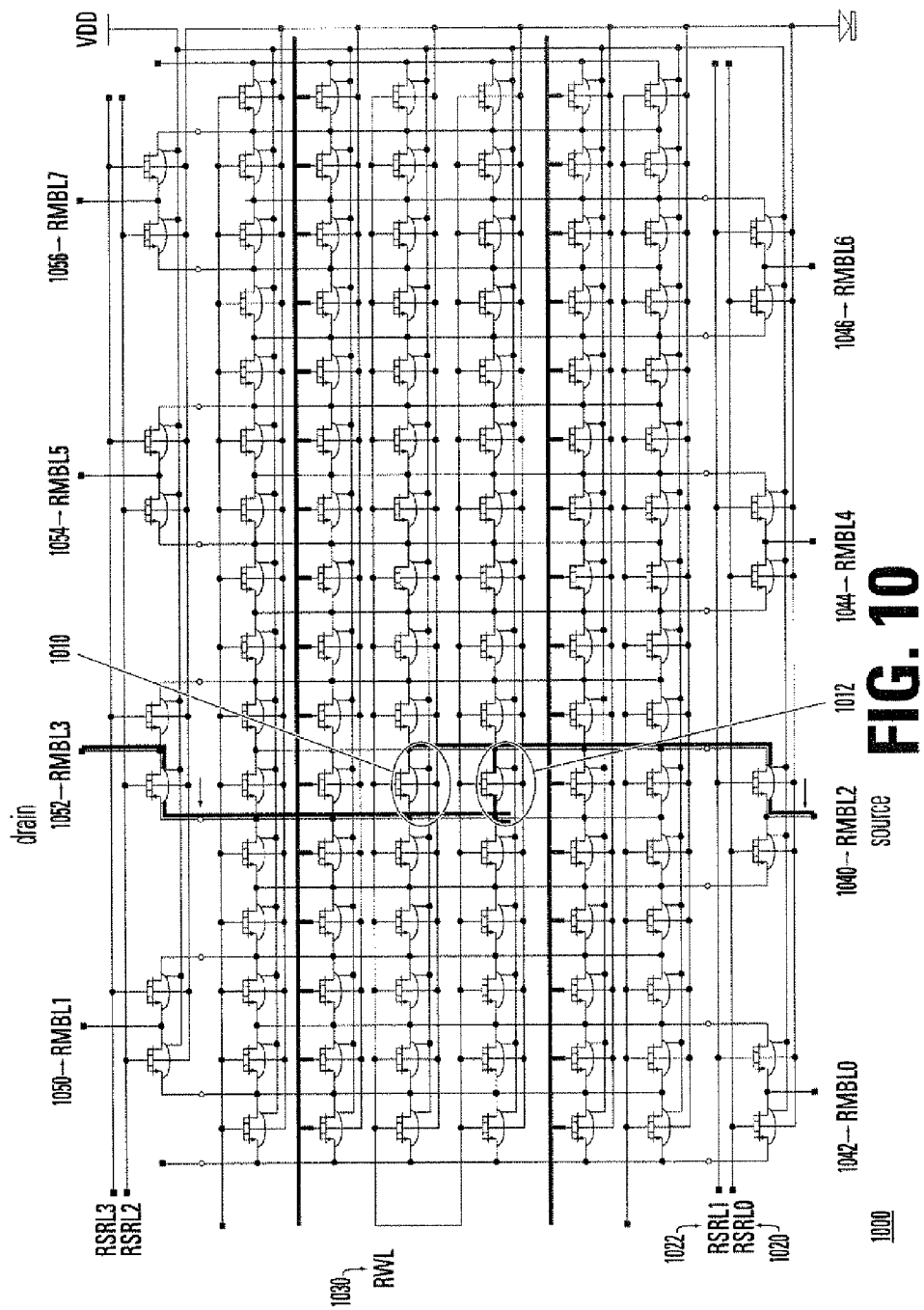
FIG. 10 is a more detailed schematic diagram of a reference mini-array in a non-volatile memory in accordance with the present invention.

FIG. 10 shows a more detailed schematic diagram of a reference mini-array 1000 in a non-volatile memory with 1C:2C sensing scheme. The reference mini-array 1000 comprises a matrix of reference cells in which reference cells 1010 and 1012 are selected for implementing the 1C:2C sensing scheme. Alternatively, a third reference cell can be selected for implementing a 1C:3C sensing scheme. The selection of the reference cells 1010 and 1012 is made by a pair of select lines RSEL0 1020 and RSEL1 1022. The gate voltage to the reference cells 1010 and 1012 is supplied from a signal line RWL 1030. The reference cells 1010 and 1012 are connected a source line RMBL2 1040 for external connection to an interconnect conductor bar. In this embodiment, source lines RMBL0 1042, RMBL4 1044 and RMBL6 1046 have been left floating. Similarly, drain signals RMBL1 1050, RMBL3 1052, RMBL5 1054 and RMBL7 1056 have also been left floating in this configuration.

The term "source line" as used in the specification refers to elements related to a source line, including a metal bit line, a local bit line and a bit line transistor (BLT) contact junction number. A large amount of capacitance in a source line derives from a metal bit line.

The invention has been described with reference to specific exemplary embodiments. Various modifications, adaptations, and changes may be made without departing from the spirit and scope of the invention. For example, one of ordinary skill in the art should recognize that additional reference memory cells in a reference array can be added to construct a 1C:MC configuration. Correspondingly, the number of source lines coupled to the reference memory can be increased to N, where M and N could be the same or different integer numbers. Accordingly, the specification and drawings are to be regarded as illustrative of the principles of this invention rather than restrictive, the invention is defined by the following appended claims.

We claim:

1. A non-volatile memory structure, comprising:
   an interconnect conductor bar;
   a main memory having a first memory cell;
   a first reference array having two or more reference memory cells, the two or more reference memory cells connected to a reference conductor line;
   a first sense amplifier having a first input coupled to a first conductor bit line connected to the first memory cell in the main memory, and a second input coupled to the interconnect conductor bar and the reference conductor line in the two or more reference memory cells; and
   at least two source lines coupled to the interconnect conductor bar, the combination of the at least two source lines, the interconnect conductor bar, and the reference conductor line providing substantial capacitance matching to the first conductor bit line from the first memory cell in the main memory array.

2. The memory structure of claim 1 wherein a source line in the at least two source lines comprises structures adapted for trimming for substantial capacitance matching to the first conductor bit line from the first memory cell in the main memory array.

3. The memory structure of claim 1 further comprising a second sense amplifier having a first input connected to a third conductor bit line from a second memory cell in the main memory array, wherein the first and second sense amplifiers are commonly coupled to the two or more reference memory cells in the first reference mini-array through the interconnect conductor bar and the reference conductor line.

4. The memory structure of claim 1 further comprising a first pass gate coupling between the first input of first sense amplifier and the main memory.

5. The memory structure of claim 1 further comprising a second pass gate coupling between the interconnect conductor bar and the at least two source lines.

6. A non-volatile memory, comprising:
   an interconnect conductor bar;
   a main memory having a first memory cell;
   a first reference array having a first reference cell and a second reference cell, the first and second reference cells connected to the interconnect conductor bar;
   a first sense amplifier having a first input coupled to a first conductor bit line connected to the first memory cell in the main memory, and a second input coupled to the interconnect conductor bar and a reference conductor line connected to the first and second reference cells; and
   a first and second source lines coupled to the interconnect conductor bar, wherein the second source line has a different length than the first source line.

7. The non-volatile memory of claim 6 wherein the combination of the first and second source lines, the interconnect conductor bar, and the reference conductor bar provides substantial capacitance matching to the first conductor bit line from the first memory cell in the main memory array.

8. The non-volatile memory of claim 6 wherein the second source line is less than the first source line for reducing the capacitance in the second input to the sense amplifier for substantially capacitance matching between the first and second sources in the reference array and the first conductor bit line in the main memory array.

9. The non-volatile memory of claim 6 wherein the second source line is greater than the first source line for increasing the capacitance in the second input to the sense amplifier for substantial capacitance matching between the first and second sources in the reference array and the first conductor bit line from the main memory array.

10. A method for capacitance matching on a source side in a sense amplifier having a first input coupled to a main memory array and a second input coupled to a reference array, comprising:
    measuring the capacitance of a metal bit line from the main memory array to a first input of a sense amplifier;
    measuring the capacitance of a metal bit line from the reference array to a second input of the sense amplifier;
    comparing the capacitance from the metal bit line from the main memory array with the capacitance of the metal bit line from the reference array; and
    adjusting a source line coupling to the second input of the sense amplifier and the reference array for substantial capacitance matching between the metal bit line from the main memory array and the metal bit line from the reference array.

11. The method of claim 9 wherein the adjusting step comprises cutting one or more segments from the source line if the capacitance from the metal bit line from the main memory array is less than the metal bit line from the reference array.

12. The method of claim 9 wherein the adjusting step comprises adding one or more segments to the source line if the capacitance from the metal bit line from the main memory array is greater than the metal bit line from the reference array.

* * * * *